United States Patent
McKee

(10) Patent No.: US 7,714,917 B2
(45) Date of Patent: May 11, 2010

(54) METHOD AND APPARATUS PROVIDING A TWO-WAY SHARED STORAGE GATE ON A FOUR-WAY SHARED PIXEL

(75) Inventor: Jeffrey A. McKee, Meridian, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 1128 days.

(21) Appl. No.: 11/213,936

(22) Filed: Aug. 30, 2005

(65) Prior Publication Data

US 2007/0046796 A1   Mar. 1, 2007

(51) Int. Cl.
*H04N 3/14* (2006.01)
(52) U.S. Cl. ..................................... 348/294
(58) Field of Classification Search ................ 348/294; 257/233, 293, 225, 222
See application file for complete search history.

(56) References Cited

U.S. PATENT DOCUMENTS

| | | | |
|---|---|---|---|
| 4,636,865 A | 1/1987 | Imai | |
| 5,955,753 A | 9/1999 | Takahashi | |
| 6,107,655 A | 8/2000 | Guidash | |
| 6,160,281 A | 12/2000 | Guidash | |
| 6,218,656 B1 | 4/2001 | Guidash | |
| 6,300,977 B1 * | 10/2001 | Waechter et al. | 348/300 |
| 6,352,869 B1 | 3/2002 | Guidash | |
| 6,423,994 B1 * | 7/2002 | Guidash | 257/292 |
| 6,486,913 B1 * | 11/2002 | Afghahi et al. | 348/308 |
| 6,552,323 B2 | 4/2003 | Guidash et al. | |
| 6,657,665 B1 | 12/2003 | Guidash | |
| 6,693,670 B1 | 2/2004 | Stark | |
| 6,750,912 B1 | 6/2004 | Tennant et al. | |
| 6,947,088 B2 | 9/2005 | Kochi | |
| 6,956,605 B1 * | 10/2005 | Hashimoto | 348/301 |
| 6,977,684 B1 | 12/2005 | Hashimoto et al. | |
| 6,998,657 B2 * | 2/2006 | Rhodes | 257/222 |
| 7,081,608 B2 | 7/2006 | Bock | |
| 7,244,918 B2 * | 7/2007 | McKee et al. | 250/208.1 |
| 7,332,786 B2 * | 2/2008 | Altice et al. | 257/445 |
| 7,443,437 B2 * | 10/2008 | Altice et al. | 348/296 |
| 2004/0252215 A1 * | 12/2004 | Mori | 348/308 |
| 2005/0082461 A1 | 4/2005 | Bock | |
| 2007/0040922 A1 * | 2/2007 | McKee et al. | 348/308 |

FOREIGN PATENT DOCUMENTS

| | | |
|---|---|---|
| EP | 0 862 219 A2 | 9/1998 |
| EP | 1017106 A2 | 7/2000 |

OTHER PUBLICATIONS

International Preliminary Report on Patentability (2 pages).
Written Opinion (4 pages).

* cited by examiner

*Primary Examiner*—Jason Chan
*Assistant Examiner*—Gary C Vieaux
(74) *Attorney, Agent, or Firm*—Dickstein Shaprio LLP

(57) ABSTRACT

A pixel array includes a first photosensor for generating charge in response to applied light, a second photosensor for generating charge in response to applied light, and a first and second storage transistor having a common first storage gate respectively connected to said first and second photosensors for storing charge from said first and second photosensors in respective first and second storage regions.

65 Claims, 9 Drawing Sheets

METHOD AND APPARATUS PROVIDING A TWO-WAY SHARED STORAGE GATE ON A FOUR-WAY SHARED PIXEL

FIELD OF THE INVENTION

The present invention relates generally to digital image sensors and in particular to a CMOS pixel cell array architecture having shared components among pixel cells of the array.

BACKGROUND OF THE INVENTION

A CMOS imager circuit includes a focal plane array of pixel cells, each one of the cells including a photosensor, for example, a photogate, photoconductor or a photodiode for accumulating photo-generated charge in a specified portion of a substrate. Each pixel cell has a charge storage region, formed on or in the substrate, which is connected to the gate of an output transistor that is part of a readout circuit. The charge storage region may be constructed as a floating diffusion region. In some imager circuits, each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel cell perform the functions of: (1) photon to charge conversion; (2) accumulation of image charge; (3) resetting the storage region to a known state; (4) transfer of charge to the storage region; (5) selection of a pixel for readout; and (6) output and amplification of a signal representing pixel charge. Photo-charge may be amplified when it moves from the initial charge accumulation region to the storage region. The charge at the storage region is typically converted to a pixel output voltage by a source follower output transistor.

CMOS imagers of the type discussed above are generally known as discussed, for example, in U.S. Pat. No. 6,140,630, U.S. Pat. No. 6,376,868, U.S. Pat. No. 6,310,366, U.S. Pat. No. 6,326,652, U.S. Pat. No. 6,204,524 and U.S. Pat. No. 6,333,205, assigned to Micron Technology, Inc., which are hereby incorporated by reference in their entirety.

With reference to FIGS. 1, 2 and 3, which respectively illustrate a top-down view, a partial cross-sectional view and electrical circuit schematic of a conventional four transistor (4T) CMOS pixel sensor cell 100. When incident light 187 strikes the surface of a photosensor (photodiode)120, electron/hole pairs are generated in the p-n junction of the photosensor (represented at the boundary of n-type accumulation region 122 and p-type surface layer 123 (FIG. 2)). The generated electrons (photo-charges) are collected in the n-type accumulation region 122 of the photosensor 120. The photo-charges move from the initial charge accumulation region 122 to a floating diffusion region 110 via a transfer transistor 106. The charge at the floating diffusion region 110 is typically converted to a pixel output voltage by a source follower transistor 108 which is output on a column output line 111 via a row select transistor 109.

Conventional CMOS imager designs, such as that shown in FIGS. 1-3 for pixel cell 100, provide only approximately a fifty percent fill factor, meaning only half of the pixel cell 100 is utilized in converting light to charge carriers. As shown, only a small portion of the cell 100 comprises a photosensor 120. The remainder of the pixel cell 100 includes isolation regions 102, shown as STI regions in a substrate 101, the floating diffusion region 110 coupled to a transfer transistor gate 106' of the transfer transistor 106, and source/drain regions 115 for reset 107, source follower 108, and row select 109 transistors having respective gates 107', 108', and 109'. Moreover, as the total pixel area continues to decrease (due to desired scaling), it becomes increasingly important to create high sensitivity photosensors that utilize a minimum amount of surface area or to find more efficient layouts on the pixel array for the non-photosensitive components of the pixel cells to provide increased photosensitive areas.

FIG. 4 illustrates in electrical schematic form a six transistor (6T) pixel cell having a storage transistor 130 and associated storage gate 130'. Storage transistors 130 having storage gates 130' and associated storage regions may be desirably used for various purposes, such as a frame shutter or to increase the charge capacity of the pixels. In addition, pixel cells also may include an anti-blooming transistor 140 having an associated gate 140' to prevent charge overflow from a charge saturated photosensor 120. However, when additional transistors, such as a storage transistor 130 and/or anti-blooming transistor 140 are added to the pixel cell, the photosensor fill factor in further decreased.

Accordingly, there is a desire for a pixel cell, which includes storage transistors and/or anti-blooming transistors with associated gates, while having an efficient layout to permit a high fill factor.

BRIEF SUMMARY OF THE INVENTION

The present invention, in the various exemplary embodiments, provides a pixel cell array and methods of forming and operating the array having multiple pixel cells that share pixel cell components. The shared pixel cell architecture increases the fill factor, and in turn, the quantum efficiency of the pixels of the pixel cell array. The common pixel cell components may be shared by a number of pixels in the array, and may include several components that are associated with the readout of a signal from the pixel cells.

Exemplary embodiments of the invention also provide a pixel array comprising at least two photosensors for generating charge in response to applied light, and a common storage gate electrically connected to the photosensors for storing charges from the photosensors into respective storage regions for subsequent transfer to a readout circuit. The readout circuit may be shared by multiple pixels.

Exemplary embodiments of the invention also provide a pixel array comprising at least two photosensors associated with respective pixels for generating charge in response to applied light and a common anti-blooming gate electrically connected to the photosensors for providing an anti-blooming function.

BRIEF DESCRIPTION OF THE DRAWINGS

The foregoing and other aspects of the invention will be better understood from the following detailed description of the invention, which is provided in connection with the accompanying drawings, in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate," as used herein, are to be understood as including silicon, epitaxial, silicon-on-insulator (SOI) or silicon-on-sapphire (SOS) technology, doped and undoped semiconductors, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The terms "pixel," or "pixel cell," as used herein, refers to a photo-element unit cell containing a photosensor and associated transistors for converting photons to an electrical signal. For purposes of illustration, a small number of representative pixels are illustrated in the figures and description herein; however, typically fabrication of a large plurality of like pixels proceeds simultaneously. Accordingly, the following detailed description is only exemplary of the invention and is not to be taken as limiting. The scope of the present invention is defined only by the appended claims.

The terms "at an angle," "angled," and "slanted," as used herein are to be interpreted as meaning at any angle, with respect to some stated reference point, that is not exactly parallel or exactly perpendicular. Accordingly, when at least a portion of an object and some reference point meet to form an angle that is not 0°, 90°, or 180°, the object is considered "angled," "at an angle," or "slanted" with respect to the reference point.

Figure 5:
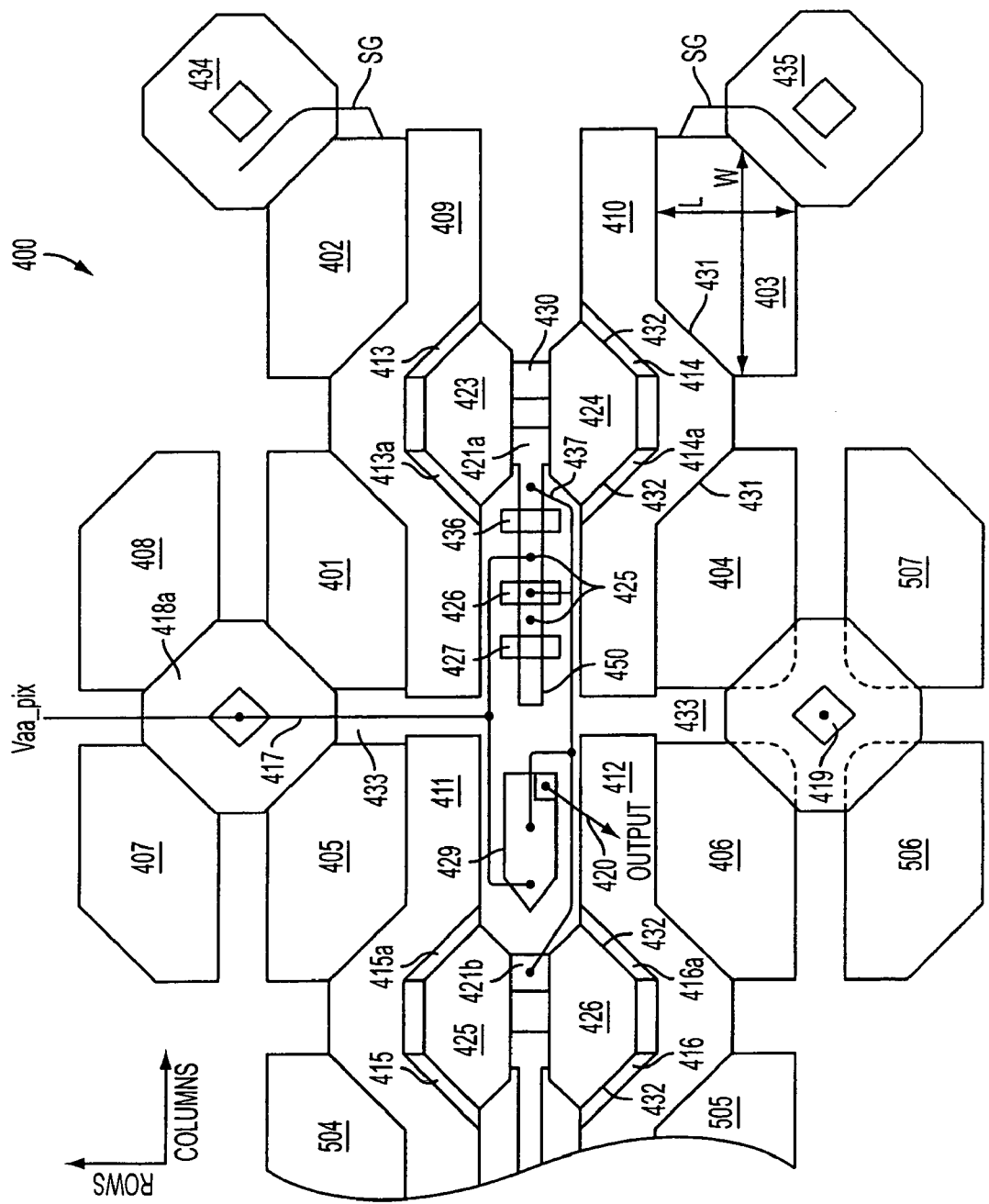
FIG. 5 is a top-down view of a portion of a pixel array constructed in accordance with an exemplary embodiment of the invention.
Figure 5A:
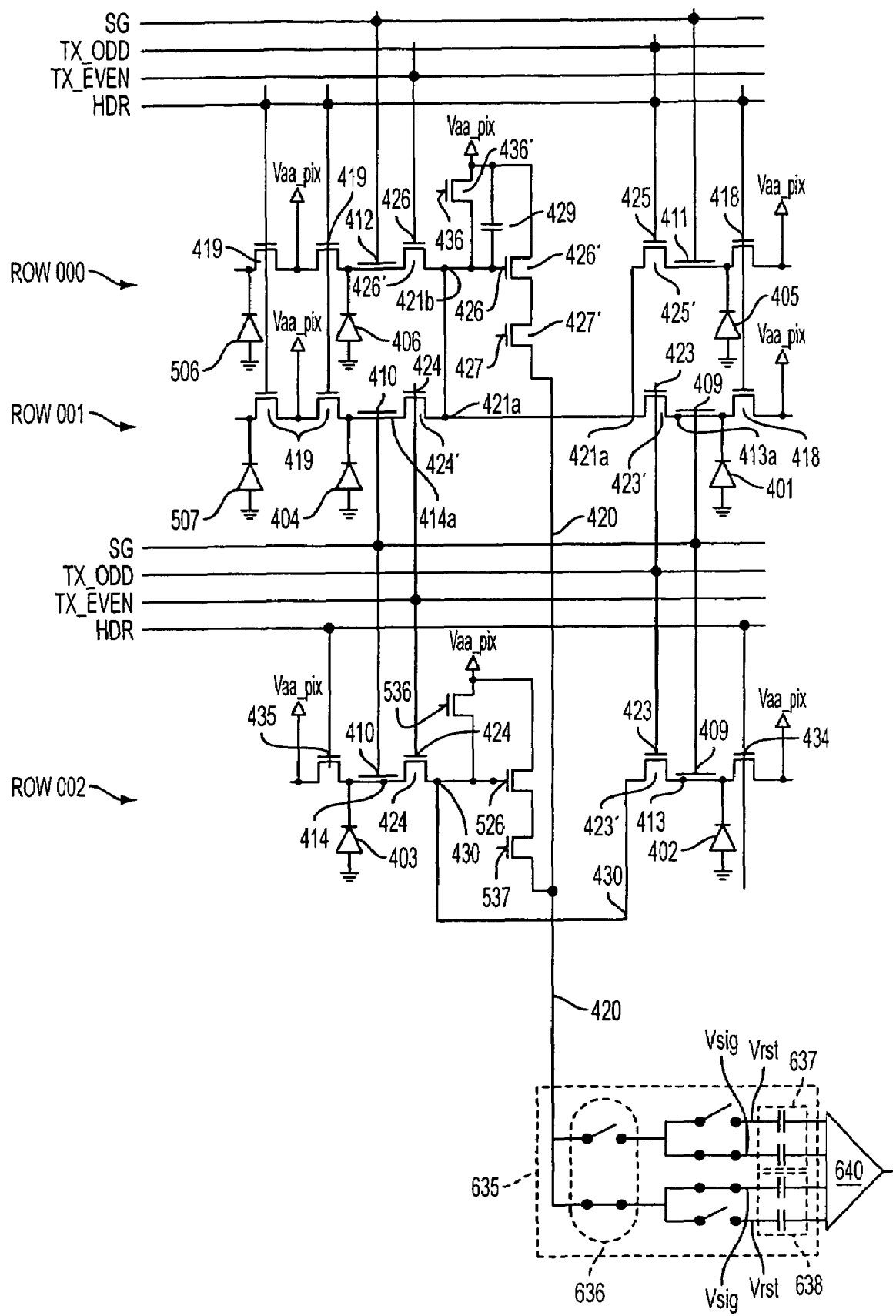
FIG. 5A is a top-down view of a portion of a pixel array constructed in accordance with an exemplary embodiment of the invention.

Now referring to the figures, where like numerals designate like elements, FIG. 5 illustrates a top-down view of a portion of a pixel array 400 constructed in and over a silicon substrate with a pixel layout design in accordance with exemplary embodiments of the present invention. FIG. 5A is a circuit diagram depicting portions of the exemplary pixel array 400.

Figure 1:
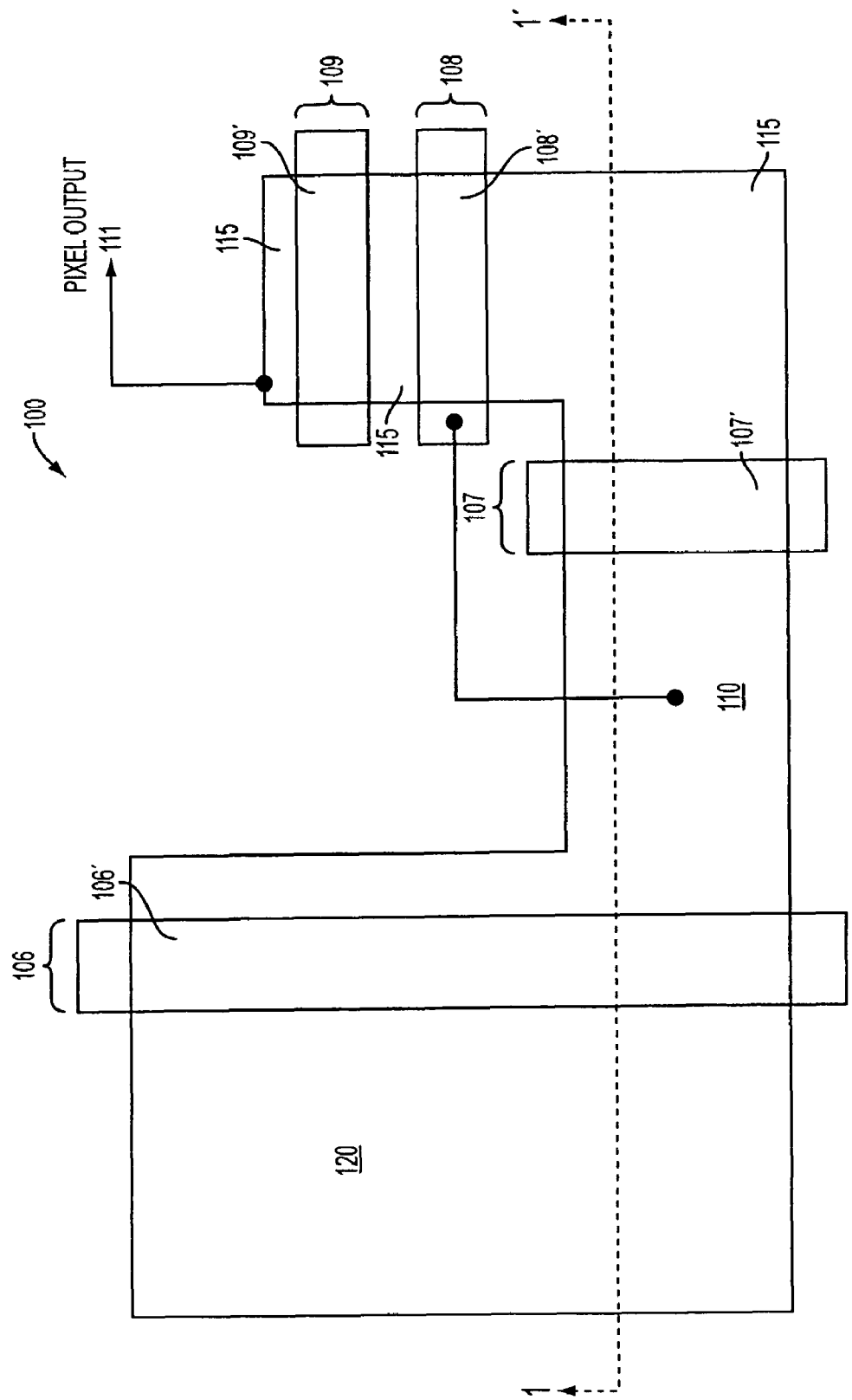
FIG. 1 is a top-down view of a conventional CMOS pixel cell.
Figure 2:
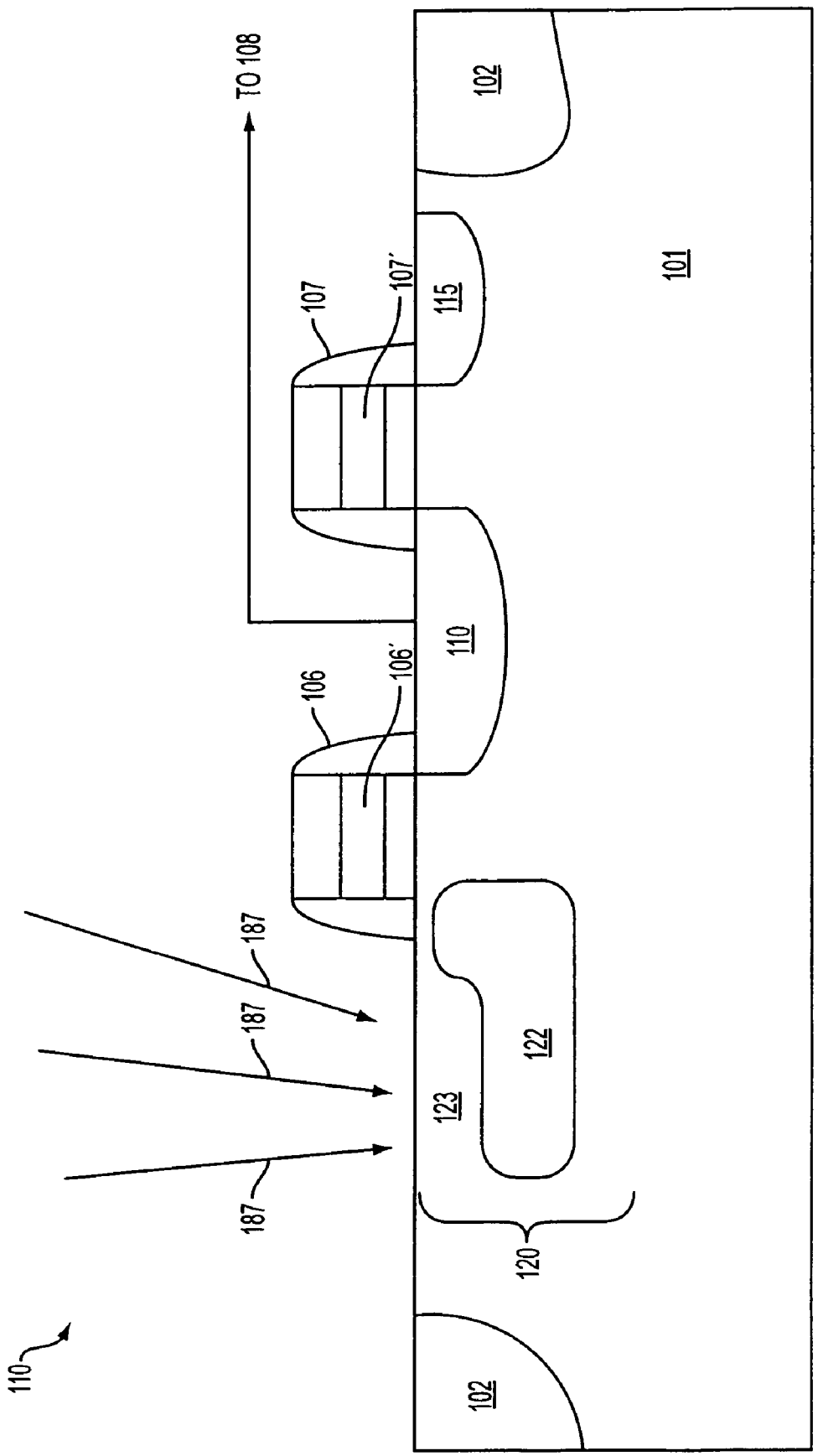
FIG. 2 is a cross-sectional view of the pixel cell of FIG. 1, taken along line 1-1'.
Figure 3:
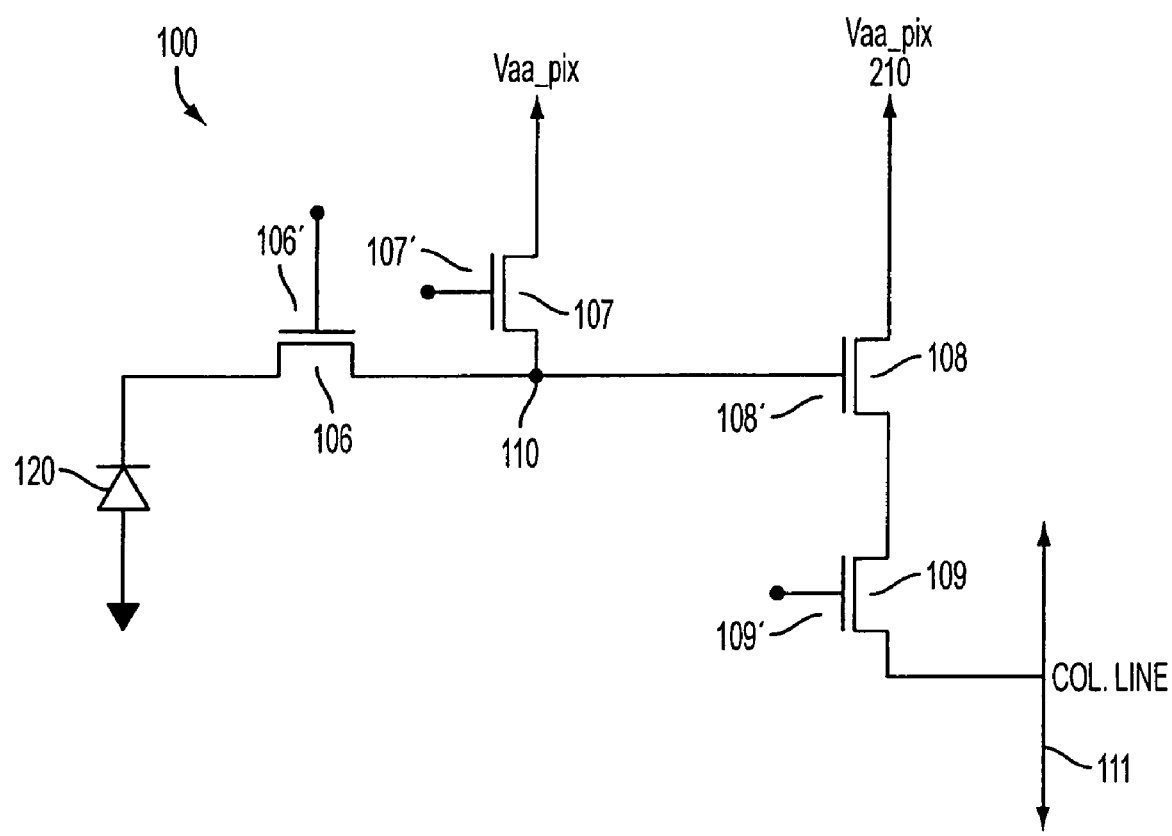
FIG. 3 is a circuit diagram of the conventional CMOS pixel of FIGS. 1 and 2.
Figure 4:
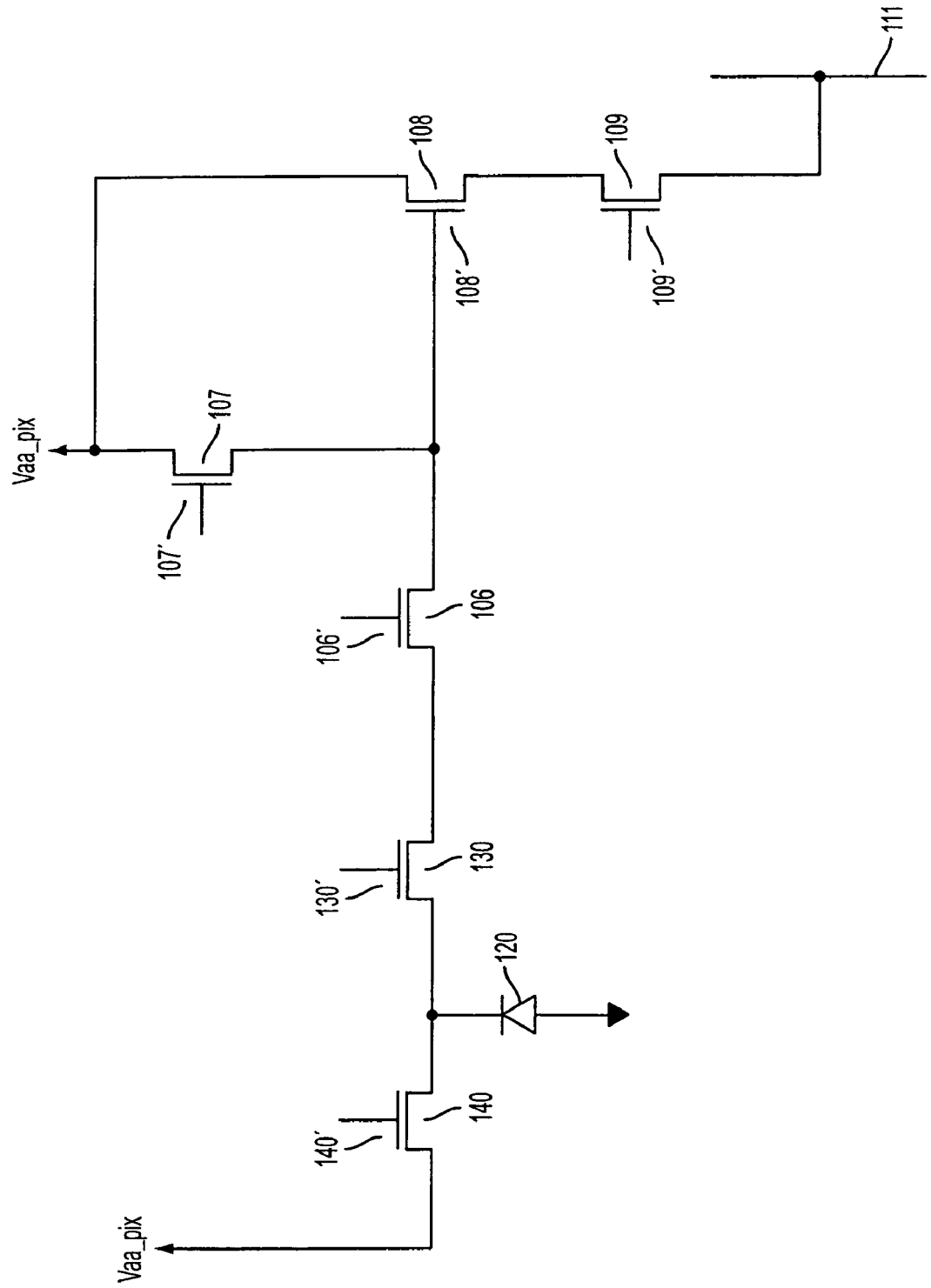
FIG. 4 is a circuit diagram of a conventional CMOS pixel which employs storage and/or anti-blooming transistors with associated gates.

The pixel array 400 includes a sharing of a pixel readout circuit by four pixels. The pixels involved in the four-way readout sharing are represented by photosensors 401, 404, 405, 406. The shared components include pixel signal readout components located on a linearly-extending trunk 450 within the area between a first pair of photosensors 401, 405 and between a second pair of photosensors 404, 406 which are adjacent to the first pair. In addition, optional anti-blooming gates 418, 419, 434, 435 are each also shared by four photosensors in array 400, though not the same four photosensors as share a common readout circuit. In the illustrated example, four photosensors 401, 405, 407, 408 are shown as having a shared anti-blooming gate 418. Photosensors 404, 406, 506, 507 also share anti-blooming gate 419. Anti-blooming gates may overlap associated photosensors as shown in detail by the exemplary dotted lines beneath anti-blooming gate 419. Anti-blooming gates 434, 435 are associated in the illustrated example with respective photosensors 402, 403 and are shared with other photosensors which are not illustrated in FIG. 4.

It should be noted that FIG. 5A depicts only three rows of a pixel array, $Row_{000}$, $Row_{001}$, $Row_{002}$. As shown, the four-way readout sharing is for pixels in $Row_{000}$ having photo sensors 405, 406 and for pixels in $Row_{001}$ having photosensors 401, 404. In a similar manner, $Row_{002}$, having pixels with photosensors 402, 403, and $Row_{003}$ (not illustrated) would have pixels sharing a readout circuit.

Column adjacent pixels (e.g. photosensors 402, 401) share a common first storage gate 409 for storing the generated photo-charges in respective first and second storage regions 413, 413a prior to a readout of the charges. First storage gate 409 may be controlled by global storage gate control signal SG shown in the FIG. 6 timing diagram explained below. The photosensors 401, 402 may be any photosensitive structure for converting light photons into electrons (photo-charges), and in a preferred embodiment, the photosensors, e.g. 401, 402, are photodiode regions.

A second storage gate 410 is shared by a second pair of column adjacent photosensors 403, 404. Charge from the photosensors 403, 404 are stored under control of gate 410 in respective third and fourth storage regions 414, 414a. Storage gate 410 may also controlled by the global storage gate control signal SG. Photosensors 405, 504 share a third storage gate 411 with their respective charges stored under control of gate 411 in respective fifth and a sixth storage regions 415a, 415. Photosensors 406, 505 share a fourth storage gate 412 with their respective charges stored in a seventh and an eighth storage regions 416a, 416. The shared storage gate configuration reduces the number of storage gate control signal lines that would otherwise be required with separate storage gates for each photosensor. At least a portion of each of the gates 409, 410, 411, 412 have side edges 431 which are preferably at an angle and at a corner with respect to the photosensors 401, 402, 403, 404, 405, 406, 504, 505, which provides for a larger photon collection area for the photosensors and, consequently, high fill factor. It should be understood that the storage regions 413, 413a, 414, 414a, 415, 415a, 416, 416a primarily comprise a doped region (n-type) located under the respective storage gates 409, 410, 411, 412 in the substrate.

As illustrated in FIGS. 5 and 5A, photosensors 401, 402 also share a transfer transistor gate 423, photosensors 403, 404 share a transfer transistor gate 424, and photosensors 405, 504 share a transfer gate 425, and photosensors 406, 505 share a transfer gate 426. At least a portion of each of the transfer transistor gates 423, 424, 425, 426 have side edges 432 preferably at an angle and at a corner with respect to each of the photosensors 401, 402, 403, 404, 405, 406, 504, 505. It should be noted that the transfer transistor gates 423, 424, 425, 426 of this embodiment are being shared, each among two column adjacent pixels in array 400. For example, as shown in FIG. 5, column adjacent photosensors 401, 402, which share storage gate 409, also share the transfer transistor gate 423. The transfer transistor gates 423, 424 transfer charges from charge storage regions 413a, 414a to a common floating diffusion region 421a.

Photosensors 401, 402 do not share a floating diffusion region or readout circuit. Rather, in the illustrated embodiment, two row adjacent pixels having photosensors 401, 404 share a first floating diffusion region 421a and two row adjacent photosensors 405, 406 share a second floating diffusion region 421b. The two floating diffusion regions 421a, 421b are electrically connected to one another, either by conductive trace or a doped region in the substrate. The floating diffusion regions 421a, 421b may also optionally be coupled to a capacitor 429 which serves to increase the charge storage capacity of the connected floating diffusion regions 421a, 421b. Capacitor 429 is also coupled to Vaa-pix and increases dynamic range. FIG. 5 also shows a third floating diffusion region 430 which is shared by row adjacent photosensors 402, 403. This region is connected to another floating diffusion region, in the same manner that regions 421a and 421b are connected.

The use of storage gates 409, 410, 411, 412 in association with storage regions 413a, 414a, 415a, 416a provides for a frame shutter and/or additional storage for photosensor charge storage for the pixels which share a readout circuit which include photosensors 401, 404, 405, 406. For example, the storage gates 409, 410, 411, 412 transfer the charges generated by the photosensors 401, 404, 405, 406 following an integration period into the associated storage region 413a, 414a, 415a, 416a, where they can be stored and read out.

Preferably, as shown in FIG. 5, each of the storage gates 409, 410, 411, 412 and transfer transistor gates 423, 424, 425, 426 have at least a portion thereof that is angled with respect to their associated photosensors 401, 402, 403, 404, 405, 406, 504, 505 so that each gate overlaps a corner region of an associated photosensor. For example, the edges 431 of the storage gate 410 are shown as being slanted with respect to the length L and the width W of the associated photosensors 403, 404 such that gate 410 overlaps an upper right-hand corner of photosensor 404 and an upper left-hand corner of photosensor 403. Similarly, each of the transfer transistor gates 423, 424, 425, 426 has an edge 432 that is similarly slanted with respect to the length L and the width W of the photosensors 403, 404 such that the gate overlaps a corner of an associated photosensor. This preferred angled geometry and photosensor overlap of the gates 409, 410, 411, 412, 423, 424, 425, 426 allows for an efficient layout of the gates 409, 410, 411, 412, 423, 424, 425, 426, to improve the leakage and lag performance of the pixels in array 400. In addition, this arrangement is also beneficial in maximizing the fill factor of array 400, by maximizing the area of the photosensors 401, 402, 403, 404, 405, 406, 504, 505. The anti-blooming gates 418, 419, 434, 435 of the optional anti-blooming transistors also have slanted edges, e.g. 418a, and also overlap a corner of an associated photosensor, e.g. 407.

The shared pixel readout structure will now be further described. One reset transistor having a gate 436 is utilized for resetting charges at the interconnected floating diffusion regions 421a, 421b. To one side of the reset gate 436 is a source/drain region 425 that is capable of receiving a supply voltage Vaa-pix. The remaining readout components on the readout trunk 450 shared among photosensors 401, 404, 405, 406 include a source follower transistor 426' having a gate 426 connected to the floating diffusion regions 421a, 421b, and a row select transistor 427' having a gate 427 which selectively gates the output of the source follower transistor 426' to a readout column line. Isolation regions 433 in the substrate are utilized to isolate the active areas on the trunk 450 from the photosensors, and to also isolate the individual charge accumulation regions of photosensors 401, 404, 405, 406 from one another. Any known isolation technique, including but not limited to shallow trench isolation (STI), may be used to form isolation regions 433.

The four-way shared pixel readout layout described herein illustratively has a first pair of column-adjacent pixels having respective photosensors 405, 406 and a second pair of column adjacent pixels having respective photosensors 401, 404 sharing one set of readout circuitry, e.g. trunk 450 leading to a column output line 420. Thus, a column output line 420 is only necessary, in accordance with this exemplary embodiment, for every other column of a pixel array 400. As such, two column-adjacent pixels, e.g. 405, 401 will be sequentially read onto the same output line 420, and their respective signals need to be separately sampled and held in order to maintain maximum resolution for the pixel array 400. Sample and hold circuit 635 (FIG. 5) is connected to a column line 420 and comprises switch 636 and two sets of capacitors 637, 638. Switch 636 determines whether the incoming signal from the column line 420 should go to the first set of capacitors 637 or the second set of capacitors 638. In practice, each pixel, as represented by a respective photosensor and the associated readout circuit, produces two output signals, a reset signal Vrst after the common floating diffusion region 421a, 421b is reset by the rest transistor, e.g. 436', and a photosensor signal Vsig produced by charges accumulated in a photosensor, e.g. 401, during an integration period. A difference signal Vrst–Vsig is produced by differential amplifier 640 for each pixel. Vrst–Vsig represents the amount of light impinging on a pixel. Accordingly, each pair of capacitors 637 and 638 receives at one capacitor of the pair a signal Vrst and at another capacitor of the pair a signal Vsig, for one of two column adjacent pixels.

Figure 6:
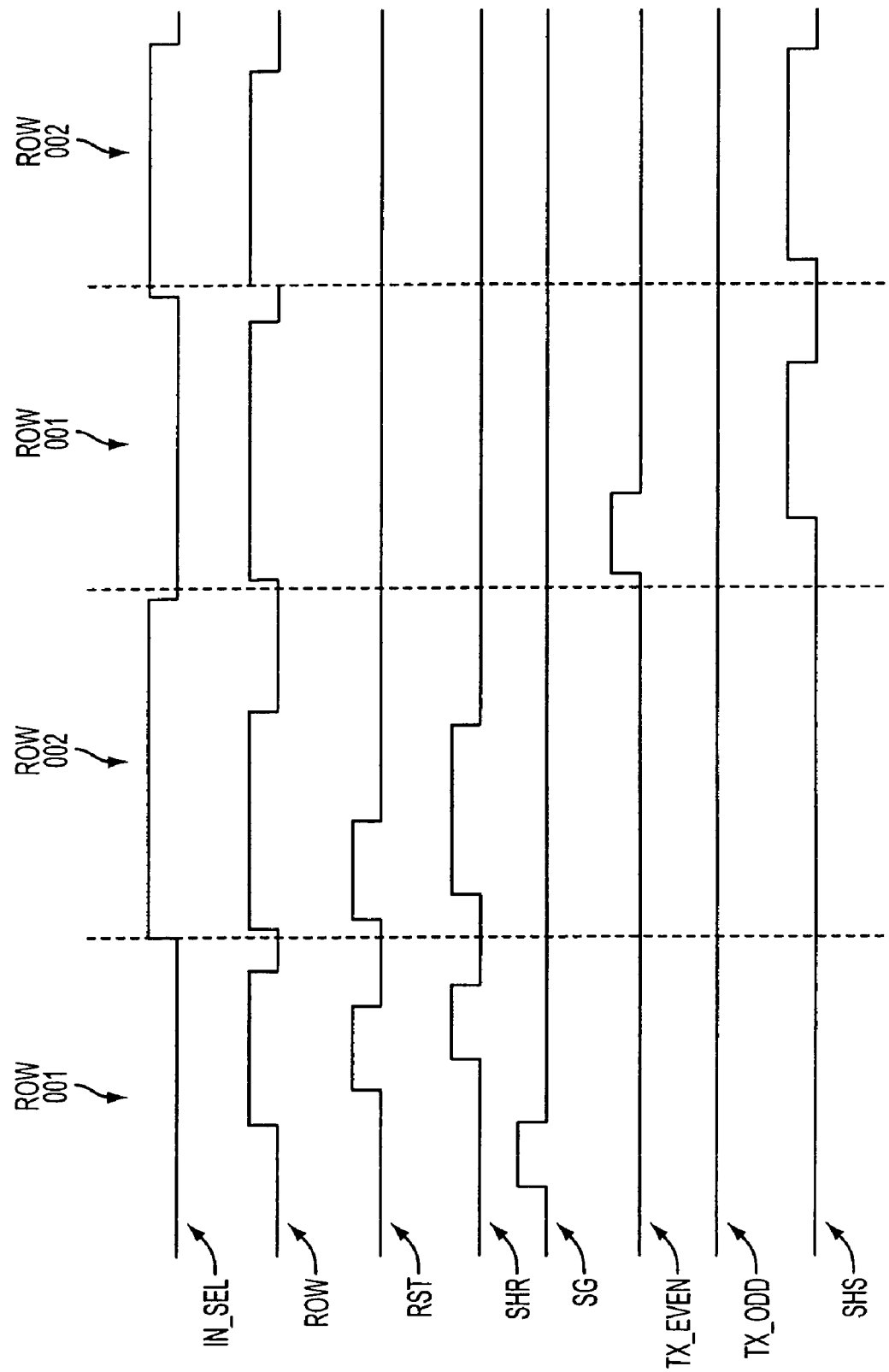
FIG. 6 is a timing diagram illustrating an exemplary method of operating a pixel array constructed in accordance with the exemplary embodiment of the invention.

FIG. 6 is a timing diagram illustrating an exemplary operation of the array 400 illustrated in FIGS. 5 and 5A. It should be noted that the transfer transistor gate signal lines TX_ODD, TX_EVEN, respectively represent the transfer control signal for the odd or even pixel columns in the array 400. Further, "Row$_{xxx}$" is used to designate row number "xxx" of the array 400. It should be noted that the timing diagram of FIG. 6 represents only one exemplary way of operating the structure depicted in FIGS. 5 and 5A and other operational schemes may be employed.

Global storage gate control signal SG is turned to high ending a photosensor integration period and charges from all photosensors are transferred through the storage gates into their respective storage regions. In this example, charge from photosensor 401 is transferred to storage region 413a, charge from photosensor 402 is transferred to storage region 413, charge from photosensor 403 is transferred to storage region 414, charge from photosensor 404 is transferred to storage region 414a, charge from photosensor 405 is transferred to storage region 415a, charge from photosensor 406 is transferred to storage region 416a, charge from photosensor 504 is transferred to storage region 415a, and charge from photosensor 505 is transferred to storage region 416a.

Subsequently, for row Row$_{001}$ of the array 400 containing photosensors 401, 404, a row select gate 427 is activated by asserting a row select signal (ROW) high. A reset of the common floating diffusion region 421a, 421b is performed by activating reset gate 436 of reset transistor 436 with reset signal Reset. A signal Vrst representing the reset condition is read out onto column line 420 and is sampled and held on the Vrst capacitor of capacitor pair 638 in sample and hold circuit 635 by sample and hold reset signal SHR. The In_sel signal controls switch 636 to determine whether the signal on column line 420 should go to the first set of capacitors 637 or the second set of capacitors 638. For $Row_{001}$, In_sel is low controlling storage of the reset signal into the reset signal capacitor of capacitor set 638 (FIG. 5A). Then, for a next row, $Row_{002}$ this same sequence of steps is repeated, turning the appropriate row select (RS) 537, reset (Reset) 536, and sample and hold reset (SHR) signals high for a second row $Row_{002}$ to read out a reset signal onto the column line 420 for a reset condition of the floating diffusion region 430 for $Row_{002}$, and a connected floating diffusion region of $Row_{003}$, which is not shown in FIG. 5A. This time, however, the In_sel signal is high, causing the signal to be stored in a reset capacitor of pair 637. Then, the row select and sample and hold signals ROW and SHS return to low.

Next, a transfer signal TX_EVEN is turned to high, to activate the even column transfer transistor gates 424 in two adjacent rows. Charges stored in the storage area 414a are thus transferred through the transfer transistor 424' into a floating diffusion region 421a and similarly for the charges generated by photosensor 403 in the next row $Row_{002}$ by turning "on" transfer transistor gate 424. Next, for $Row_{001}$, a pixel voltage signal $V_{sig}$ is read onto the column line 420 by activating the row select transistor 427' with the signal ROW, and sample and hold circuit 635 with a high SHS signal to sample the first row. This is done while the In_sel signal is low which selects the capacitor set 638 through switch 636. As a readout the photosensor 404 signal Vsig is stored on the Vsig capacitor of capacitor set 628. Capacitor set 638 now holds the reset signal Vrst and the photosensor signal Vsig corresponding to photosensor 404. For $Row_{002}$, a pixel voltage signal $V_{sig}$ is now read out repeating the pulsing of row select (ROW) and sample and hold signals (SHS). From floating diffusion region 430, a signal is generated by source follower transistor gate 526, through row select transistor 537 and onto the column line 420. During this readout, however, the In_sel signal is returned to high to store the photosensor signal Vsig from $Row_{002}$ into the Vsig capacitor of capacitor set 627. The row select and sample and hold signals ROW and SHS return again to low.

This exemplary method is performed simultaneously for every other column in a row, utilizing the alternative transfer transistor gate signal TX_ODD to activate transfer transistor gates in odd columns of the array. The method is repeated in this sequence for each pair of rows (e.g. $Row_{001}$ and $Row_{002}$, $Row_{003}$ and $Row_{004}$, etc.) until signals are read out for each pixel in array 400. It should be understood that these operational steps are exemplary only, and the invention is in no way limited to the method of readout operation as described herein.

FIGS. 5 and 5A also illustrate antiblooming gates, e.g. 418, 434, 419, 435 (FIG. 5), and assorted antiblooming transistors. The gates of the antiblooming transistors are operated by control signals on lines HDR (FIG. 5A) to limit the amount of charge which is accumulated by corresponding photosensors, e.g. 406, 404, 401, 405, during a charge integration period. The antiblooming gate may also be used as a global reset gate to begin the integration period.

Figure 7:
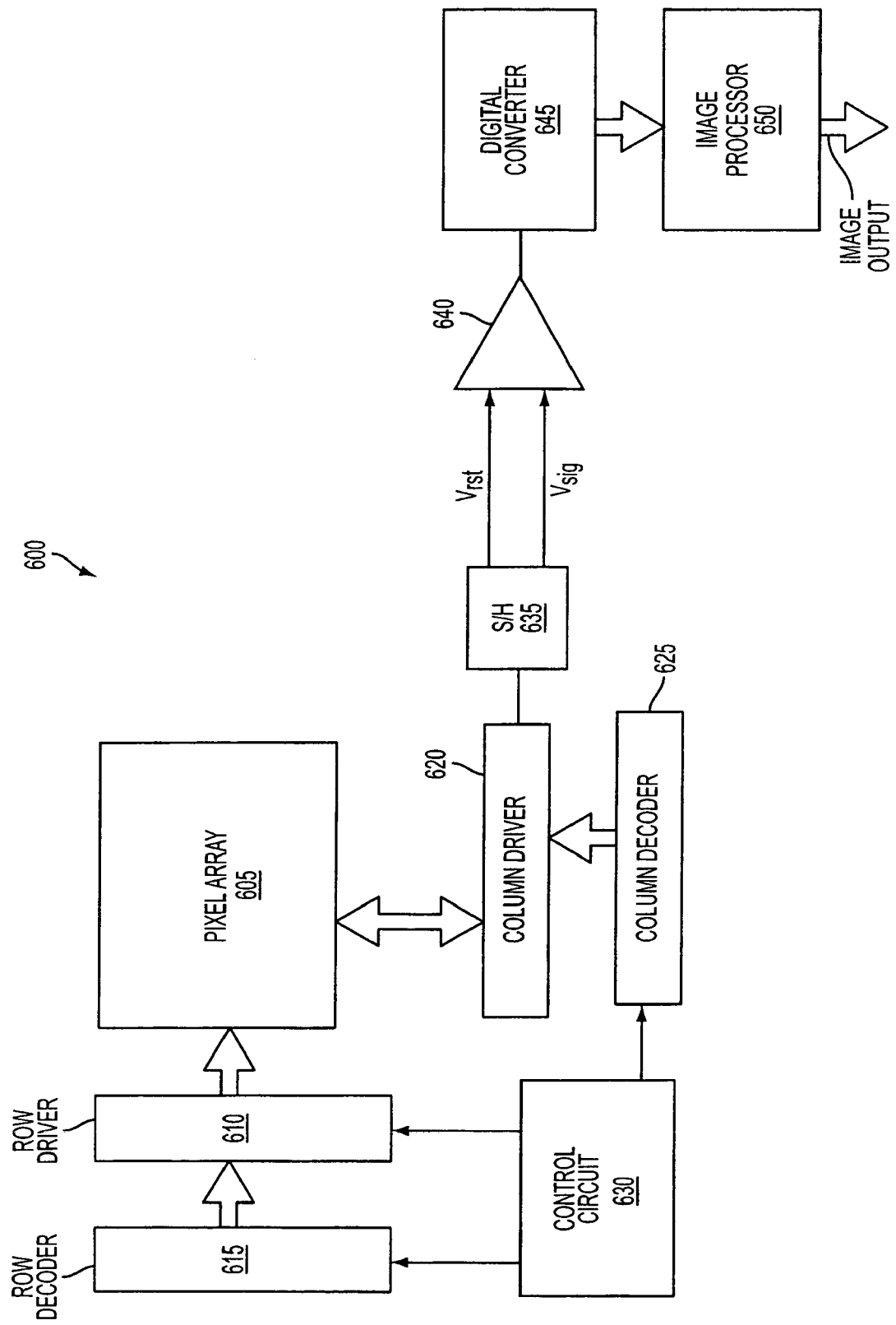
FIG. 7 is a block diagram of a CMOS imager chip having an array of pixel cells constructed in accordance with the invention.

FIG. 7 shows a CMOS imager 600 in which the invention may be employed within pixel array 605. The CMOS imager 600 is operated by a control circuit 630, which controls address decoders 615, 625 for selecting the appropriate row and column lines for pixel readout. Control circuit 630 also controls the row and column driver circuitry 610, 620 so that they apply driving voltages to the drive transistors of the selected row and column lines. As noted, the pixel output signals include a pixel reset signal Vrst read out of a floating diffusion region, e.g. 421a, 421b, after it is reset by the reset transistor and a pixel image signal Vsig, which is read out of the floating diffusion region after photo-generated charges are transferred there by a transfer gate from a storage region controlled by a storage gate. For each pixel, the Vrst and Vsig signals are sampled by the sample and hold circuit 635 and are subtracted by a differential amplifier 640, to produce a differential signal Vrst–Vsig representing the amount of light impinging on the pixels. This difference signal is digitized by an analog-to-digital converter 645. The digitized pixel signals are fed to an image processor 650 to form a digital image output. The digitizing and image processing can be located on or off the imager chip. In some arrangements the differential signal Vrst–Vsig can be amplified as a differential signal and directly digitized by a differential analog to digital converter.

Figure 8:
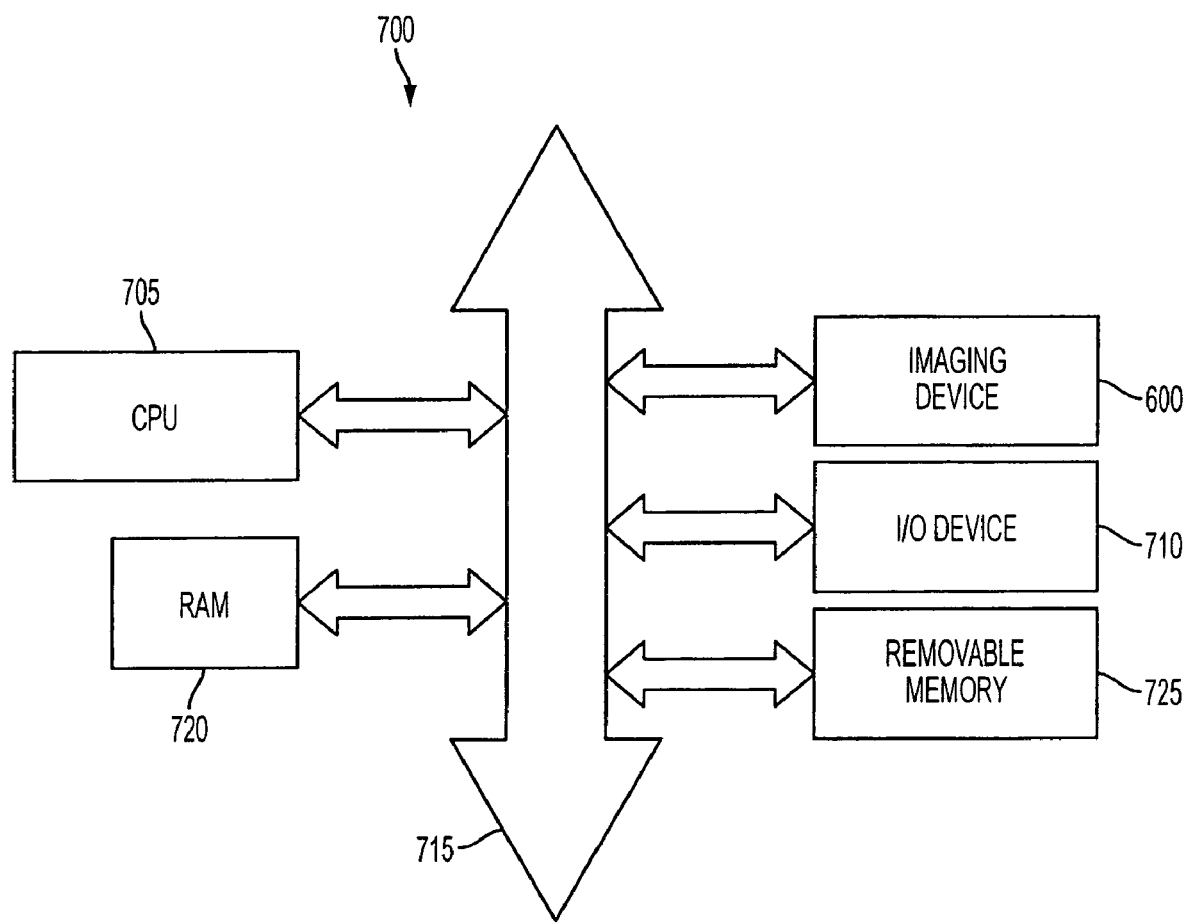
FIG. 8 is a schematic diagram of a processing system employing a CMOS imager constructed in accordance with the invention.

FIG. 8 illustrates an imaging processor-based system 700, for example a camera system, which generally comprises a central processing unit (CPU) 705, such as a microprocessor, that communicates with an input/output (I/O) device 710 over a bus 715. The system 700 also includes an imaging device 600 constructed in accordance with the embodiments of the invention described herein. Imager 600 also communicates with the CPU 705 over bus 715. The processor-based system 700 also includes random access memory (RAM) 720, and can include removable memory 725, such as flash memory, which also communicate with CPU 705 over the bus 715. Imager 600 may be combined with a processor, such as a CPU, digital signal processor, or microprocessor, with or without memory storage on a single integrated circuit or on a different chip than the processor.

The invention further includes a method of operating a pixel array of the embodiments illustrated in FIGS. 5-8. The method comprises the steps of generating charge in response to applied light in a first photosensor, generating charge in response to applied light in a second photosensor, and storing charge from the first and second photosensors in respective first and second storage regions with a first and second storage transistor having a common first storage gate respectively connected to the first and second photosensors. The first and second photosensors are column adjacent.

The invention further includes a method of forming a pixel array of the embodiments illustrated in FIGS. 5-8. The method comprises the steps of forming a first photosensor for generating charge in response to applied light, forming a second photosensor for generating charge in response to applied light, and forming a first and second storage transistor having a common first storage gate respectively connected to the first and second photosensors for storing charge from the first and second photosensors in respective first and second storage regions. The first and second photosensors are column adjacent.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. For example, although the invention is discussed only with reference to pixel arrays having a 4-pixel sharing of a readout circuit and a two-pixel sharing of storage and transfer gates, other multi-pixel sharing arrays are also intended to be within the scope of the invention. Additionally, any modifications, though pres-

What is claimed as new and desired to be protected by Letters Patent of the United States is:

1. A pixel array comprising:
   a first photosensor for generating charge in response to applied light;
   a second photosensor for generating charge in response to applied light;
   first and second storage transistors having a structurally common first storage gate respectively connected to said first and second photosensors for storing charge from said first and second photosensors in respective first and second storage regions; and
   first and second transfer transistors having a common first transfer gate for respectively transferring said generated charges from said respective first and second storage regions to respective first and second floating diffusion regions, wherein said first and second photosensors are column adjacent.

2. The pixel array of claim 1, further comprising:
   first and second readout circuits for receiving said generated charges from said respective first and second floating diffusion regions.

3. The pixel array of claim 2, wherein said common first storage gate and said common first transfer gate are located at a corner of each of said first and second photosensors.

4. The pixel array of claim 2, further comprising:
   a third photosensor for generating charge in response to applied light; and
   a third storage transistor having a second storage gate connected to said third photosensor for storing charge from said third photosensor in a third storage region, wherein said first and third photosensors are row adjacent.

5. The pixel array of claim 4, further comprising:
   a third transfer transistor having a second transfer gate for transferring said generated charges from said third storage region to said first floating diffusion region.

6. The pixel array of claim 5, further comprising:
   a fourth photosensor for generating charge in response to applied light;
   a fourth storage transistor having a third storage gate connected to said fourth photosensor for storing charge from said fourth photosensor in a fourth storage region; and
   a fourth transfer transistor having a third transfer gate for transferring said generated charges from said fourth storage region to a third floating diffusion region, wherein said first and fourth photosensors are column adjacent, said first and third floating diffusion regions are electrically connected, and said first readout circuit receives said generated charges from said first and third floating diffusion regions.

7. The pixel array of claim 6, further comprising:
   a fifth photosensor for generating charge in response to applied light;
   a fifth storage transistor having a fourth storage gate connected to said fifth photosensor for storing charge from said fifth photosensor in a fifth storage region; and
   a fifth transfer transistor having a fourth transfer gate for transferring said generated charges from said fifth storage region to said third floating diffusion region, wherein said third and fifth photosensors are column adjacent.

8. The pixel array of claim 7, wherein said first, third, fourth, and fifth photosensors share said first readout circuit.

9. The pixel array of claim 7, further comprising:
   a first control signal line, wherein said first, second, third, and fourth storage gates are connected to said control signal line.

10. The pixel array of claim 9, further comprising:
    a second control signal line; and
    a third control signal line, wherein for a given array row, said second control signal line is connected to said transfer transistor gates for even-numbered columns, and said third control signal line is connected to transfer transistor gates for odd-numbered columns.

11. The pixel array of claim 10, further comprising a sample and hold circuit for storing a reset voltage and an output voltage from said first and second readout circuits.

12. The pixel array of claim 11, further comprising a first antiblooming transistor having a first antiblooming gate for limiting the amount of charge which is accumulated by said first photosensor.

13. The pixel array of claim 12, further comprising: a second antiblooming transistor for limiting the amount of charge which is accumulated by said fourth photosensor, wherein said first and second antiblooming transistors share said first antiblooming gate.

14. An imager comprising:
    an array of pixels, said array of pixels comprising:
    a first photosensor for generating charge in response to applied light;
    a second photosensor for generating charge in response to applied light;
    first and second storage transistors having a structurally common first storage gate respectively connected to said first and second photosensors for storing charge from said first and second photosensors in respective first and second storage regions; and
    first and second transfer transistors having a common first transfer gate for respectively transferring said generated charges from said respective first and second storage regions to respective first and second floating diffusion regions, wherein said first and second photosensors are column adjacent.

15. The imager of claim 14, further comprising:
    first and second readout circuits for receiving said generated charges from said respective first and second floating diffusion regions.

16. The imager of claim 15, wherein said common first storage gate and said common first transfer gate are located at a corner of each of said first and second photosensors.

17. The imager of claim 15, further comprising:
    a third photosensor for generating charge in response to applied light; and
    a third storage transistor having a second storage gate connected to said third photosensor for storing charge from said third photosensor in a third storage region, wherein said first and third photosensors are row adjacent.

18. The imager of claim 17, further comprising:
    a third transfer transistor having a second transfer gate for transferring said generated charges from said third storage region to said first floating diffusion region.

19. The imager of claim 18, further comprising:
    a fourth photosensor for generating charge in response to applied light;

a fourth storage transistor having a third storage gate connected to said fourth photosensor for storing charge from said fourth photosensor in a fourth storage region; and a fourth transfer transistor having a third transfer gate for transferring said generated charges from said fourth storage region to a third floating diffusion region, wherein said first and fourth photosensors are column adjacent, said first and third floating diffusion regions are electrically connected, and said first readout circuit receives said generated charges from said first and third floating diffusion regions.

20. The imager of claim 19, further comprising: a fifth photosensor for generating charge in response to applied light;

a fifth storage transistor having a fourth storage gate connected to said fifth photosensor for storing charge from said fifth photosensor in a fifth storage region; and a fifth transfer transistor having a fourth transfer gate for transferring said generated charges from said fifth storage region to said third floating diffusion region, wherein said third and fifth photosensors are column adjacent.

21. The imager of claim 20, wherein said first, third, fourth, and fifth photosensors share said first readout circuit.

22. The imager of claim 20, further comprising: a first control signal line, wherein said first, second, third, and fourth storage gates are connected to said control signal line.

23. The imager of claim 22, further comprising:
a second control signal line; and
a third control signal line, wherein for a given array row, said second control signal line is connected to said transfer transistor gates for even-numbered columns, and said third control signal line is connected to transfer transistor gates for odd-numbered columns.

24. The imager of claim 23, further comprising a sample and hold circuit for storing a reset voltage and an output voltage from said first and second readout circuits.

25. The imager of claim 24, further comprising a first antiblooming transistor having a first antiblooming gate for limiting the amount of charge which is accumulated by said first photosensor.

26. The imager of claim 25, further comprising: a second antiblooming transistor for limiting the amount of charge which is accumulated by said fourth photosensor, wherein said first and second antiblooming transistors share said first antiblooming gate.

27. A processing system comprising:
a processor; and
an imager comprising an array of pixels, said array of pixels comprising:
a first photosensor for generating charge in response to applied light;
a second photosensor for generating charge in response to applied light;
first and second storage transistors having a structurally common first storage gate respectively connected to said first and second photosensors for storing charge from said first and second photosensors in respective first and second storage regions; and
first and second transfer transistors having a common first transfer gate for respectively transferring said generated charges from said respective first and second storage regions to respective first and second floating diffusion regions, wherein said first and second photosensors are colunm adjacent.

28. The processing system of claim 27, further comprising: first and second readout circuits for receiving said generated charges from said respective first and second floating diffusion regions.

29. The processing system of claim 28, wherein said common first storage gate and said common first transfer gate are located at a corner of each of said first and second photosensors.

30. The processing system of claim 28, further comprising:
a third photosensor for generating charge in response to applied light; and
a third storage transistor having a second storage gate connected to said third photosensor for storing charge from said third photosensor in a third storage region, wherein said first and third photosensors are row adjacent.

31. The processing system of claim 30, further comprising:
a third transfer transistor having a second transfer gate for transferring said generated charges from said third storage region to said first floating diffusion region.

32. The processing system of claim 31, further comprising:
a fourth photosensor for generating charge in response to applied light;
a fourth storage transistor having a third storage gate connected to said fourth photosensor for storing charge from said fourth photosensor in a fourth storage region; and
a fourth transfer transistor having a third transfer gate for transferring said generated charges from said fourth storage region to a third floating diffusion region, wherein said first and fourth photosensors are column adjacent, said first and third floating diffusion regions are electrically connected, and said first readout circuit receives said generated charges from said first and third floating diffusion regions.

33. The processing system of claim 32, further comprising:
a fifth photosensor for generating charge in response to applied light;
a fifth storage transistor having a fourth storage gate connected to said fifth photosensor for storing charge from said fifth photosensor in a fifth storage region; and
a fifth transfer transistor having a fourth transfer gate for transferring said generated charges from said fifth storage region to said third floating diffusion region, wherein said third and fifth photosensors are column adjacent.

34. The processing system of claim 33, wherein said first, third, fourth, and fifth photosensors share said first readout circuit.

35. The processing system of claim 33, further comprising: a first control signal line, wherein said first, second, third, and fourth storage gates are connected to said control signal line.

36. The processing system of claim 35, further comprising: a second control signal line; and a third control signal line, wherein for a given array row, said second control signal line is connected to said transfer transistor gates for even-numbered columns, and said third control signal line is connected to transfer transistor gates for odd-numbered columns.

37. The processing system of claim 36, further comprising a sample and hold circuit for storing a reset voltage and an output voltage from said first and second readout circuits.

38. The processing system of claim 37, further comprising a first antiblooming transistor having a first antiblooming gate for limiting the amount of charge which is accumulated by said first photosensor.

39. The processing system of claim 38, further comprising: a second antiblooming transistor for limiting the amount of charge which is accumulated by said fourth photosensor, wherein said first and second antiblooming transistors share said first antiblooming gate.

40. A method of operating a pixel array comprising the steps of:
   generating charge in response to applied light in a first photosensor;
   generating charge in response to applied light in a second photosensor;
   storing charge from said first and second photosensors in respective first and second storage regions with first and second storage transistors having a structurally common first storage gate respectively connected to said first and second photosensors; and
   respectively transferring said generated charges from said respective first and second storage regions to respective first and second floating diffusion regions with respective first and second transfer transistors having a common first transfer gate, wherein said first and second photosensors are column adjacent.

41. The method of claim 40, further comprising the steps of:
   receiving said generated charges from said respective first and second floating diffusion regions in respective first and second readout circuits.

42. The method of claim 41, wherein said common first storage gate and said common first transfer gate are located at a corner of each of said first and second photosensors.

43. The method of claim 41, further comprising the steps of:
   generating charge in response to applied light in a third photosensor; and
   storing charge from said third photosensor in a third storage region in a third storage transistor having a second storage gate connected to said third photosensor, wherein said first and third photosensors are row adjacent.

44. The method of claim 43, further comprising: transferring said generated charges from said third storage region to said first floating diffusion region with a third transfer transistor having a second transfer gate.

45. The method of claim 44, further comprising the steps of:
   generating charge in response to applied light in a fourth photosensor;
   storing charge from said fourth photosensor in a fourth storage region in a fourth storage transistor having a third storage gate connected to said fourth photosensor;
   transferring said generated charges from said fourth storage region to a third floating diffusion region with a fourth transfer transistor having a third transfer gate; and
   receiving said generated charges from said first and third floating diffusion regions in said first readout circuit, wherein said first and fourth photosensors are column adjacent, and said first and third floating diffusion regions are electrically connected.

46. The method of claim 45, further comprising the steps of:
   generating charge in response to applied light in a fifth photosensor;
   storing charge from said fifth photosensor in a fifth storage region in a fifth storage transistor having a fourth storage gate connected to said fifth photosensor; and
   transferring said generated charges from said fifth storage region to said third floating diffusion region with a fifth transfer transistor having a fourth transfer gate, wherein said third and fifth photosensors are column adjacent.

47. The method of claim 46, wherein further comprising the step of sharing said first readout circuit among said first, third, fourth, and fifth photosensors.

48. The method of claim 46, further comprising the step of: controlling said first, second, third, and fourth storage gates with a control signal line.

49. The method of claim 48, wherein for a given array row, transfer transistor gates for even-numbered columns are activated simultaneously and transfer transistor gates for odd-numbered columns are activated simultaneously.

50. The method of claim 49, further comprising the step of storing a reset voltage and an output voltage from said first and second readout circuits in a sample and hold circuit.

51. The method of claim 50, further comprising the step of limiting the amount of charge which is accumulated by said first photosensor with a first antiblooming transistor having a first antiblooming gate.

52. The method of claim 51, further comprising the step of: limiting the amount of charge which is accumulated by said fourth photosensor with a second antiblooming transistor, wherein said first and second antiblooming transistors share said first antiblooming gate.

53. A method of forming a pixel array comprising the steps of:
   forming a first photosensor for generating charge in response to applied light;
   forming a second photosensor for generating charge in response to applied light;
   forming first and second storage transistors having a structurally common first storage gate respectively connected to said first and second photosensors for storing charge from said first and second photosensors in respective first and second storage regions; and
   forming first and second transfer transistors having a common first transfer gate for respectively transferring said generated charges from said respective first and second storage regions to respective first and second floating diffusion regions, wherein said first and second photosensors are column adjacent.

54. The method of claim 53, further comprising the step of:
   forming first and second readout circuits for receiving said generated charges from said respective first and second floating diffusion regions.

55. The method of claim 54, wherein said common first storage gate and said common first transfer gate are formed at a corner of each of said first and second photosensors.

56. The method of claim 54, further comprising the steps of:
   forming a third photosensor for generating charge in response to applied light; and
   forming a third storage transistor having a second storage gate connected to said third photosensor for storing charge from said third photosensor in a third storage region, wherein said first and third photo sensors are row adjacent.

57. The method of claim 56, further comprising the step of:
   forming a third transfer transistor having a second transfer gate for transferring said generated charges from said third storage region to said first floating diffusion region.

58. The method of claim 57, further comprising the steps of:
   forming a fourth photosensor for generating charge in response to applied light;
   forming a fourth storage transistor having a third storage gate connected to said fourth photosensor for storing charge from said fourth photosensor in a fourth storage region; and forming a fourth transfer transistor having a third transfer gate for transferring said generated charges from said fourth storage region to a third floating diffusion region, wherein said first and fourth photosensors are column adjacent, said first and third floating diffusion regions are electrically connected, and said first readout circuit receives said generated charges from said first and third floating diffusion regions.

59. The method of claim 58, further comprising the steps of: forming a fifth photosensor for generating charge in response to applied light; forming a fifth storage transistor having a fourth storage gate connected to said fifth photosensor for storing charge from said fifth photosensor in a fifth storage region; and forming a fifth transfer transistor having a fourth transfer gate for transferring said generated charges from said fifth storage region to said third floating diffusion region, wherein said third and fifth photosensors are column adjacent.

60. The method of claim 59, wherein said first, third, fourth, and fifth photosensors share said first readout circuit.

61. The method of claim 59, further comprising the steps of: forming a first control signal line, wherein said first, second, third, and fourth storage gates are connected to said control signal line.

62. The method of claim 61, further comprising the steps of:
forming a second control signal line; and
forming a third control signal line, wherein for a given array row, said second control signal line is connected to said transfer transistor gates for even-numbered columns, and said third control signal line is connected to transfer transistor gates for odd-numbered colunms.

63. The method of claim 62, further comprising the step of forming a sample and hold circuit for storing a reset voltage and an output voltage from said first and second readout circuits.

64. The method of claim 63, further comprising the step of forming a first antiblooming transistor having a first antiblooming gate for limiting the amount of charge which is accumulated by said first photosensor.

65. The method of claim 64, further comprising the step of: forming a second antiblooming transistor for limiting the amount of charge which is accumulated by said fourth photosensor, wherein said first and second antiblooming transistors share said first antiblooming gate.

* * * * *